United States Patent
Iizuka et al.

(10) Patent No.: US 10,431,366 B2
(45) Date of Patent: Oct. 1, 2019

(54) NOISE FILTER

(71) Applicants: YAZAKI CORPORATION, Tokyo (JP); TOYOTA JIDOSHA KABUSHIKI KAISHA, Toyota-shi, Aichi-ken (JP)

(72) Inventors: Hayato Iizuka, Kakegawa (JP); Kazuma Kayo, Kakegawa (JP); Hiroshi Aihara, Toyota (JP)

(73) Assignees: YAZAKI CORPORATION, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/021,703

(22) Filed: Jun. 28, 2018

(65) Prior Publication Data
US 2019/0006080 A1    Jan. 3, 2019

(30) Foreign Application Priority Data

Jun. 29, 2017  (JP) ................. 2017-127600

(51) Int. Cl.
H01F 17/06 (2006.01)
H01F 3/10 (2006.01)
(Continued)

(52) U.S. Cl.
CPC ............. *H01F 17/06* (2013.01); *H01F 3/10* (2013.01); *H01F 17/062* (2013.01); *H01F 37/00* (2013.01);
(Continued)

(58) Field of Classification Search
CPC ........... H03H 7/427; H01F 17/06; H01F 3/10; H01F 17/062

USPC ......... 336/211, 212, 216, 227; 333/181, 185
See application file for complete search history.

(56) References Cited

U.S. PATENT DOCUMENTS

2015/0102882 A1    4/2015  Shudarek
2016/0362074 A1   12/2016  Yamaguchi et al.
(Continued)

FOREIGN PATENT DOCUMENTS

CN    204424050 U    6/2015
EP     1439554 A1    7/2004
(Continued)

OTHER PUBLICATIONS

Communication dated Nov. 30, 2018, from the European Patent Office in counterpart European Application No. 18180741.3.
(Continued)

*Primary Examiner* — Rakesh B Patel
(74) *Attorney, Agent, or Firm* — Sughrue Mion, PLLC

(57) ABSTRACT

A noise filter (10) used for a plurality of conducting members (20), the noise filter includes, a ring-shaped core (30) made from a magnetic material, the ring-shaped core is attached to the plurality of conducting members to reduce noise of currents flowing through each of the plurality of the conducting members. The ring-shaped core including: a base core (41) having a plurality of support pillar portions (42) extending outward in radial directions; and a plurality of divisional cores (45) each being placed between two of the plurality of the support pillar portions adjacent to each other in the circumferential direction, and each having two end surfaces connected to end portions of the two of the plurality of the support pillar portions.

5 Claims, 5 Drawing Sheets

(51) Int. Cl.
  *H03H 7/42*   (2006.01)
  *H01F 37/00*  (2006.01)
  *H02M 1/12*   (2006.01)
  *B60R 16/02*  (2006.01)
  *H01F 27/26*  (2006.01)

(52) U.S. Cl.
  CPC ............ *H02M 1/126* (2013.01); *H03H 7/427* (2013.01); *B60R 16/02* (2013.01); *H01F 27/263* (2013.01); *H01F 2017/065* (2013.01); *H01F 2017/067* (2013.01)

(56) References Cited

U.S. PATENT DOCUMENTS

2017/0154718 A1   6/2017  Maeda et al.
2019/0006092 A1*  1/2019  Iizuka ................... H01F 17/04

FOREIGN PATENT DOCUMENTS

| JP | 2009-135271 A | 6/2009 |
| JP | 2009-158501 A | 7/2009 |
| JP | 2009-206178 A | 9/2009 |
| JP | 2014-96535 A  | 5/2014 |
| JP | 2017-5921 A   | 1/2017 |
| WO | 2007125989 A1 | 11/2007 |

OTHER PUBLICATIONS

Communication dated Jul. 2, 2019, issued by the Japanese Patent Office in counterpart Japanese Application No. 2017-127600.

* cited by examiner

NOISE FILTER

CROSS-REFERENCES TO RELATED APPLICATION(S)

This application is based on and claims priority from Japanese Patent Application No. 2017-127600 filed on Jun. 29, 2017, and the entire contents of which are incorporated herein by reference.

BACKGROUND

The present invention relates to a noise filter.

Among conventional noise filters for reducing noise such as a surge current flowing through an electric wire has been used to reduce both of normal-mode noise that reciprocates between lines and common-mode noise that travels between a line and a ground.

As for details of the above mounting structure, refer to JP 2009-206178 A and JP 2009-135271 A.

SUMMARY

Incidentally, the noise filter disclosed in Patent document 1 requires cumbersome assembling work of winding a coil around a bobbin, inserting a pair of E-shaped cores into the bobbin from opposite directions, and joining them to each other. It is therefore desired that this noise filter be increased in the efficiency of assembling work. In the noise filter disclosed in Patent document 2 in which lead wires are inserted through a rectangular core, it is difficult to attach lead wires in a later step. And increase in the noise reducing effect is desired.

An object of the invention is therefore to provide a noise filter that can reduce both of common-mode noise and normal-mode noise satisfactorily and is superior in the efficiency of assembling work.

Embodiments of the present invention provide the following items (1) to (4):

(1) A noise filter used for a plurality of conducting members, the noise filter comprising, a ring-shaped core made from a magnetic material, the ring-shaped core being attached to the plurality of conducting members to reduce noise of currents flowing through each of the plurality of the conducting members, the ring-shaped core including:

a base core having a plurality of support pillar portions extending outward in radial directions; and a plurality of divisional cores each being placed between two of the plurality of the support pillar portions adjacent to each other in the circumferential direction, and each having two end surfaces connected to end portions of the two of the plurality of the support pillar portions, the plurality of the divisional cores being configured to allow the plurality of the conducting members to be wound on the plurality of the divisional cores, a magnetic path being formed between the end surface of each of the plurality of the divisional cores and the end portion of each of the plurality of the support pillar portions contacting the end surface, the ring-shaped core being configured to form a common-mode magnetic path passing through all of the plurality of the divisional cores and all of the end portions of the plurality of the support pillar portions and normal-mode magnetic paths each passing through one of the plurality of the divisional cores and the two of the plurality of the support pillar portions connected to the one of the plurality of the divisional cores, the normal-mode magnetic paths being the same in number as the conducting members.

(2) The noise filter according to item (1), wherein the end surface of each of the plurality of the divisional cores and the end portion of each of the plurality of the support pillar portions contacting the end surface are connected through an adhesive member capable of containing a magnetic material.

(3) The noise filter according to item (1) or item (2), wherein each of the divisional cores is shaped to have an arc shape.

(4) The noise filter according to any one of item (1) to item (3), wherein the divisional cores of the ring-shaped core are arranged in a circumferential direction at equal intervals.

According to first aspect of the invention, relating to the item (1), the common-mode magnetic path is formed which passes through all of the divisional cores and the end portions of all of the support pillar portions of the base core and plural normal-mode magnetic paths are also formed each of which passes through a divisional core and those two support pillar portions of the base core to which the divisional core is joined. The normal-mode magnetic paths are the same in number as the lead wires. As such, the noise filter can reduce both of common-mode noise and normal-mode noise when currents flow through the lead wires. Furthermore, since the divisional cores on which the respective lead wires are wound are joined to the end portions of the support pillar portions of the base core, the noise filter can be assembled easily and the efficiency of assembling work can be increased.

According to second aspect of the invention, relating to the item (2), the magnetic fluxes of the common-mode magnetic path and each normal-mode magnetic path can be adjusted properly while heating of the ring-shaped core is suppressed by adjusting the thickness of each adhesive member or having each adhesive member contain a magnetic material and adjusting its content.

According to third aspect of the invention, relating to the item (3), since each divisional core is shaped like an arc, magnetic flux unevenness in each divisional core can be prevented, which enables a good noise reducing effect.

According to fourth aspect of the invention, relating to the item (4), since the divisional cores are arranged at equal intervals in the circumferential direction, the magnetic fluxes of the normal-mode magnetic paths can be well-balanced and the noise reducing effects for the respective lead wires can be made high and uniform.

According to the invention, it is possible to provide a noise filter that can reduce both of common-mode noise and normal-mode noise satisfactorily and is superior in the efficiency of assembling work.

The invention has been described above concisely. The details of the invention will become more apparent when the modes for carrying out the invention (hereinafter referred to as an embodiment) described below are read through with reference to the accompanying drawings.

DETAILED DESCRIPTION

Embodiment

Figure 1:
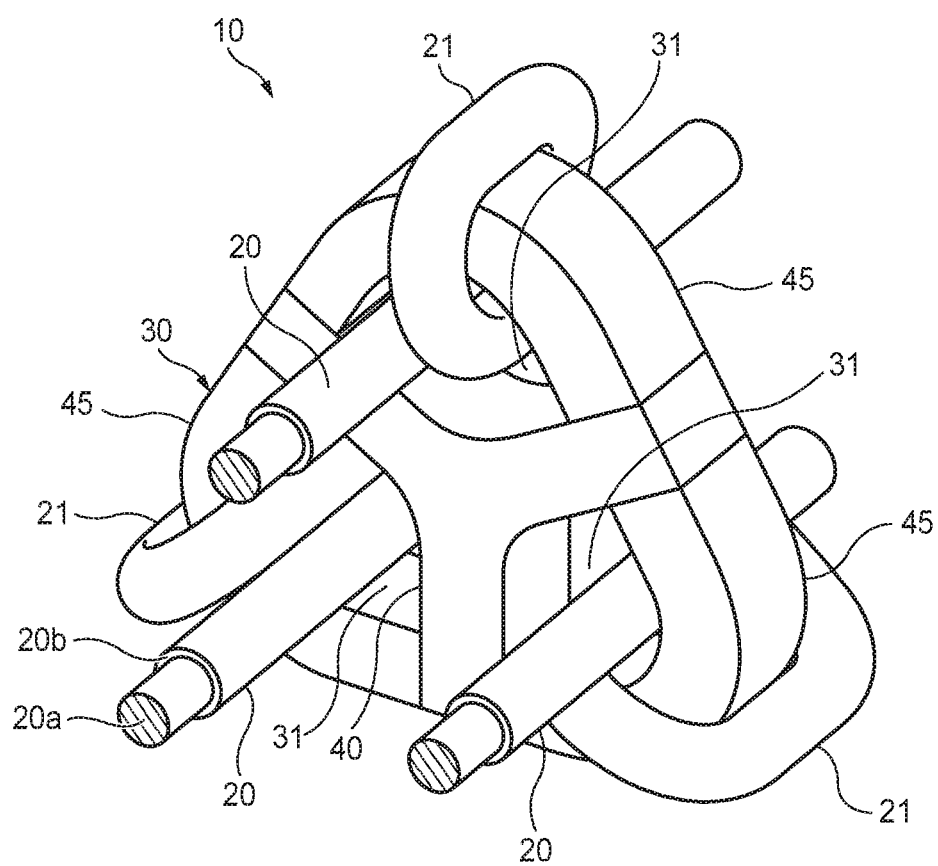
FIG. 1 is a perspective view of a noise filter according to an embodiment of the present invention.
Figure 2:
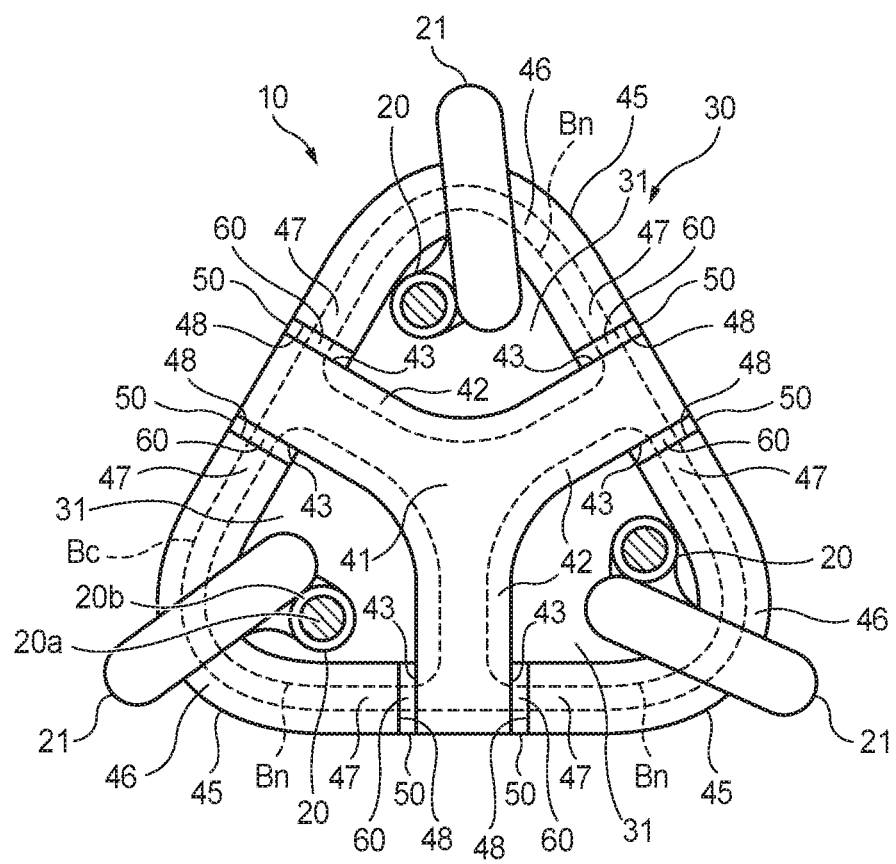
FIG. 2 is a front view of the noise filter according to the embodiment.
Figure 3:
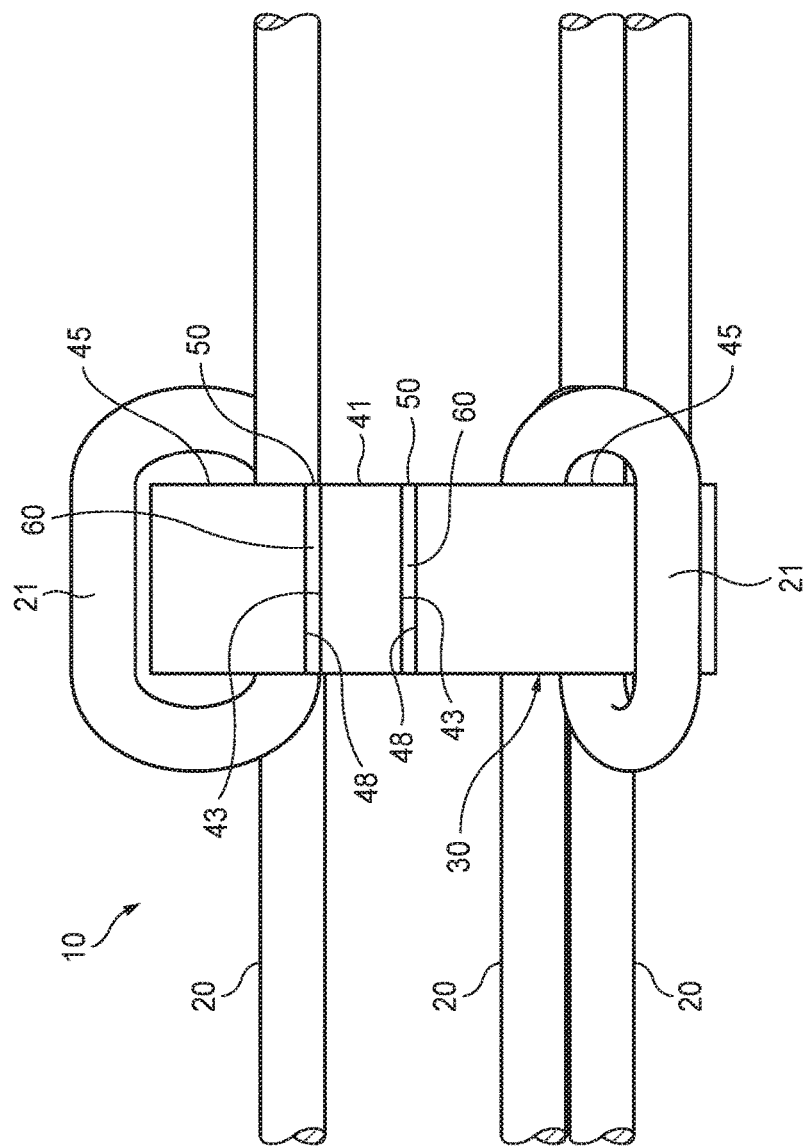
FIG. 3 is a side view of the noise filter according to the embodiment.

An embodiment of the present invention be hereinafter described with reference to the drawings. FIGS. 1-3 are a perspective view, a front view, and a side view, respectively, of a noise filter 10 according to the embodiment.

As shown in FIGS. 1-3, the noise filter 10 is configured in such a manner that a ring-shaped core 30 is attached to three lead wires 20. For example, the noise filter 10 is provided for a wire harness that connects an inverter and a motor of an electric vehicle, a hybrid car, or the like. The inverter converts a DC voltage of a power source such as a battery into an AC voltage and thereby drives the motor for rotating wheels. Since the inverter converts a DC voltage into an AC voltage by high-speed switching, a high-frequency surge current generated by the switching may flow through wires of the wire harness. Provided in the wire harness that connects the inverter and the motor, the noise filter 10 reduces noise generated by the switching.

Each lead wire 20 is an insulated electric wire obtained by covering, with an outer sheath 20b, a core wire 20a that is a stranded wire of plural element wires made of a conductive metal material.

Figure 4:
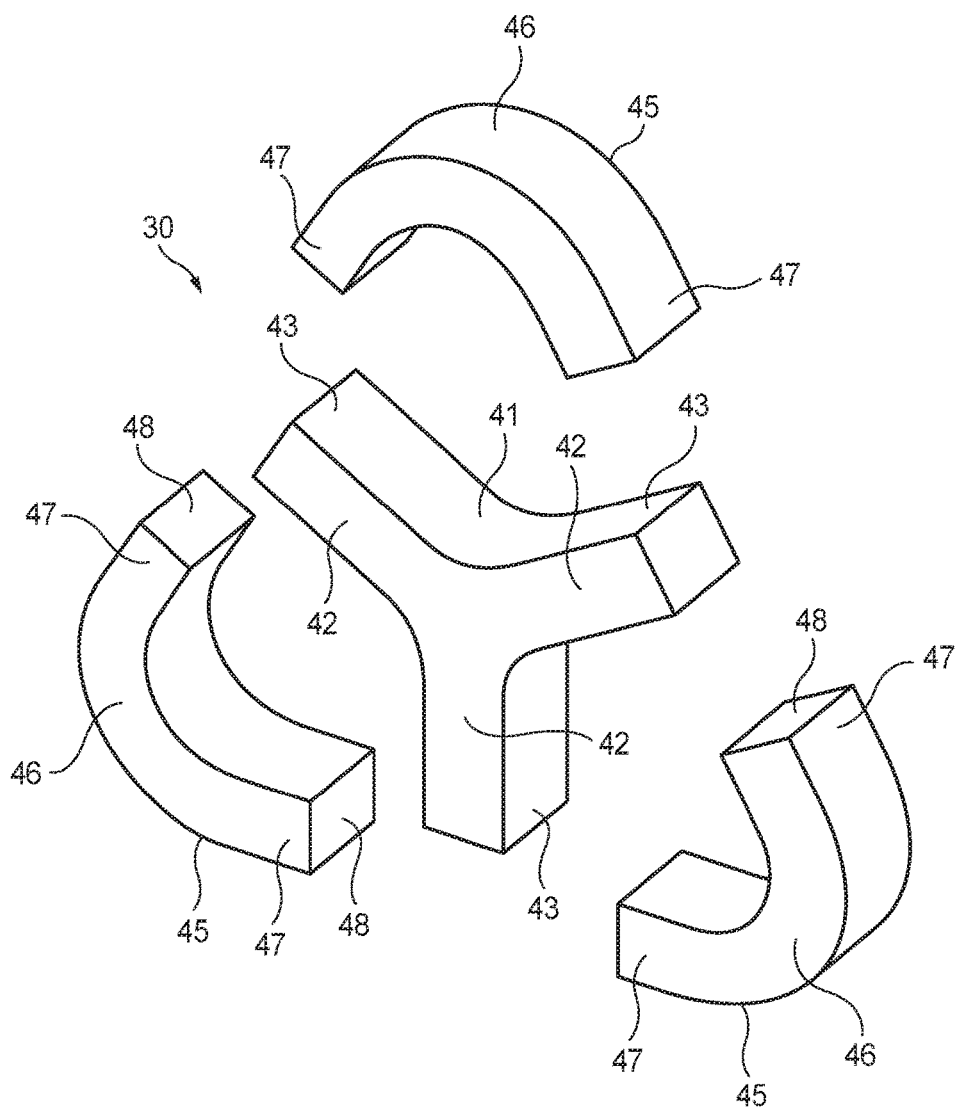
FIG. 4 is an exploded perspective view of a ring-shaped core of the noise filter according to the embodiment.

FIG. 4 is an exploded perspective view of the ring-shaped core 30 of the noise filter 10 according to the embodiment. As shown in FIG. 4, the ring-shaped core 30 is composed of a base core 41 and three divisional cores 45. The base core 41 and the three divisional cores 45 are made of, for example, a magnetic material such as ferrite.

The base core 41 has three support pillar portions 42 which extend outward in radial directions and are arranged in the circumferential directions at equal intervals. Two side surfaces of an end portion of each support pillar portion 42 are joining surfaces 43.

Each divisional core 45 has an arc portion 46 and link portions 47. The arc portion 46 is curved like an arc and is provided with straight link portions 47 at the two respective ends. The end surface of each link portion 47 is a joining surface 48.

Each divisional core 45 is disposed between adjacent ones of the support pillar portions 42, and the joining surfaces 48 of the link portions 47 of each divisional core 45 are joined to the associated joining surfaces 43 of the end portions the adjacent support pillar portion 42 of the base core 41. As a result, the ring-shaped core 30 is shaped like a triangle in a front view and has plural (in this example, three) insertion passages 31 which are formed by the base core 41 and the respective divisional cores 45.

The lead wires 20 are attached to the respective divisional cores 45 of the ring-shaped core 30, that is, wound on the arc portions 46 of the divisional cores 45, respectively, and those portions of the lead wires 20 which are wound on the arc portions 46 are winding portions 21, respectively. The winding portions 21 are wound so as to partially project outward relative to the ring-shaped core 30, and two end portions of each winding portion 21 are inserted through the associated insertion passage 31.

Magnetic path forming portions 50 are formed between the joining surfaces 43 of the end portion of each support pillar portion 42 of the base core 41 and the joining surfaces 48 of the link portions 48 of the two adjacent divisional cores 45, respectively. A magnetic path is formed so as to pass through each magnetic path forming portion 50, the adjacent support pillar portion 42 of the base core 41, and the adjacent link portion 47 of the divisional core 45.

An adhesive member 60, which is in paste or sheet form, for example, is interposed as a magnetic path forming portion 50 between each pair of joining surfaces 43 and 48. Each pair of joining surfaces 43 and 48 are bonded and joined to each other by an adhesive member 60.

As shown in FIG. 2, a common-mode magnetic path Bc is formed in the ring-shaped core 30 having the above structure as a ring-shaped magnetic path that passes through all of the divisional cores 45 and the end portions of all of the support pillar portions 42 of the base core 41. Plural normal-mode magnetic paths Bn are also formed in the ring-shaped core 30 as ring-shaped magnetic paths each of which passes through a divisional core 45 and those two support pillar portions 42 of the base core 41 to which the divisional core 45 is joined and surrounds the insertion passage 31 through which the two end portions of the winding portion 21 of the associated lead wire 20 are inserted.

The magnetic fluxes of the common-mode magnetic path Bc and each normal-mode magnetic path Bn are adjusted by adjusting the interval between each pair of joining surfaces 43 and 48 by changing the thickness of each adhesive member 60, that is, each magnetic path forming portion 50. Each adhesive member 60 may contain, for example, a magnetic material such as a ferrite powder. The magnetic fluxes of the common-mode magnetic path Bc and each normal-mode magnetic path Bn can also be adjusted by presence/absence of a magnetic material and its content (if it is contained).

To assemble the noise filter 10 having the above configuration, first, lead wires 20 are wound on the arc portions 46 of divisional cores 45, respectively. Subsequently, adhesive members 60 are stuck to the joining surfaces 48 of the link portions 47 of the divisional cores 45 and each pair of joining surfaces 43 and 48 are brought into contact with each other via an adhesive member 60 and thereby bonded to each other.

As a result, a noise filter 10 is obtained in which the lead wires 20 are attached to the respective arc-shaped divisional cores 45 of the ring-shaped core 30 and a magnetic path forming portion 50 is formed between each joining surface 43 of each support pillar portion 42 of the base core 41 and the opposed joining surface 48 of the associated link portion 47 of the divisional core 45.

In the thus-produced noise filter 10, a common-mode magnetic path Bc is formed as a ring-shaped magnetic path that passes through all of the divisional cores 45 and the end portions of all of the support pillar portions 42 of the base core 41 and plural normal-mode magnetic paths Bn are formed as ring-shaped magnetic paths each of which passes through a divisional core 45 and those two support pillar portions 42 of the base core 41 to which the divisional core 45 is joined and surrounds the insertion passage 31 through which the two end portions of the winding portion 21 of the associated lead wire 20 are inserted.

In this noise filter 10, when currents flow through the lead wires 20, common-mode noise is suppressed by the common-mode magnetic path Bc and normal-mode noise is suppressed by each normal-mode magnetic path Bn.

In the noise filter 10 according to the embodiment, as described above, the common-mode magnetic path Bc is formed which passes through all of the divisional cores 45 and the end portions of all of the support pillar portions 42 of the base core 41 and plural normal-mode magnetic paths Bn are also formed each of which passes through a divisional core 45 and those two support pillar portions 42 of the base core 41 to which the divisional core 45 is joined. The normal-mode magnetic paths Bn are the same in number as the lead wires 20. As such, the noise filter 10 can reduce both of common-mode noise and normal-mode noise when currents flow through the lead wires 20. Furthermore, since the divisional cores 45 on which the respective lead wires 20 are wound are joined to the end portions of the support pillar portions 42 of the base core 41, the noise filter 10 can be assembled easily and the efficiency of assembling work can be increased.

The magnetic fluxes of the common-mode magnetic path Bc and each normal-mode magnetic path Bn can be adjusted properly while heating of the ring-shaped core 30 is suppressed by adjusting the thickness of each adhesive member 60 of the magnetic path forming portion 50 or having each adhesive member 60 contain a magnetic material and adjusting its content.

Since each divisional core 45 is shaped like an arc, magnetic flux unevenness in each divisional core 45 can be prevented, which enables a good noise reducing effect.

Furthermore, since the divisional cores 45 are arranged at equal intervals in the circumferential direction, the magnetic fluxes of the normal-mode magnetic paths Bn can be well-balanced and the noise reducing effects for the respective lead wires 20 can be made high and uniform.

Other Embodiments

The invention is not limited to the above embodiment and various modifications, improvements, etc. can be made as appropriate. The materials, shapes, sets of dimensions, numbers, locations, etc. of the respective constituent elements of the above embodiment are not limited to those disclosed but can be determined in desired manners as long as the invention can be implemented.

For example, although the noise filter 10 according to the above embodiment is equipped with the three lead wires 20, the number of lead wires 20 is not limited to three and may be any plural number.

Figure 5:
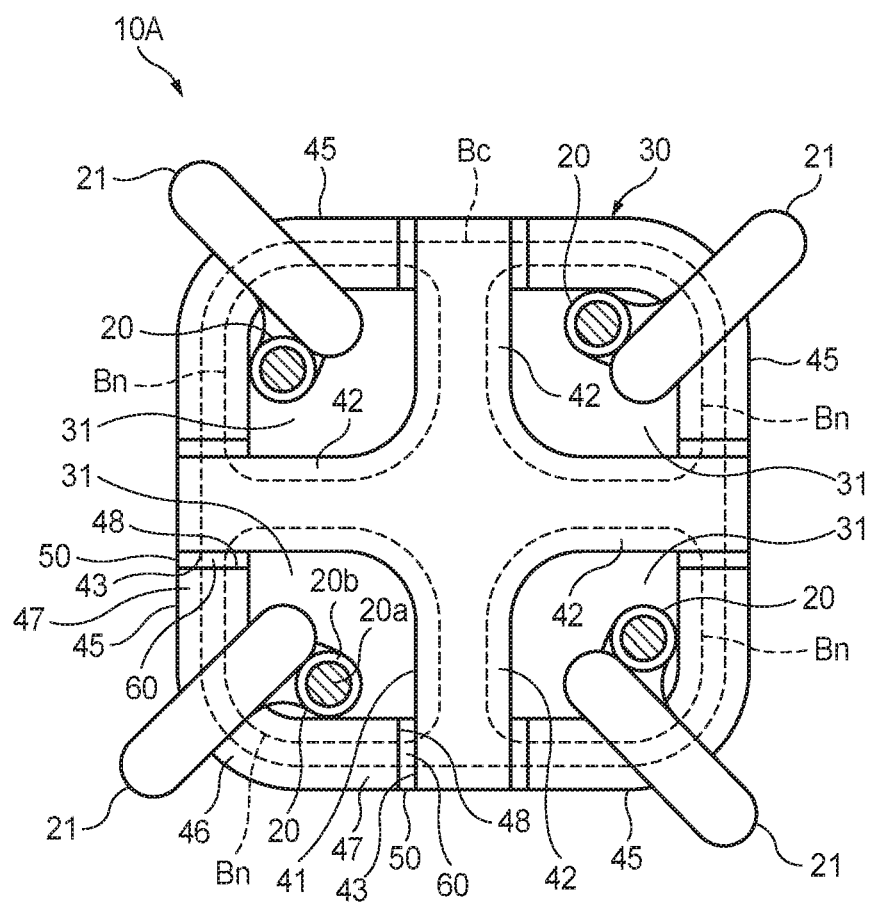
FIG. 5 is a front view of a noise filter according to a modification.

A noise filter having four lead wires 20 will be described below. FIG. 5 is a front view of a noise filter 10A according to a modification.

As shown in FIG. 5, the noise filter 10A according to the modification is a noise filter for a wire harness having four lead wires 20.

In the noise filter 10A according to the modification, a ring-shaped core 30 is composed of a base core 41 having four support pillar portions 42 which extend outward in radial directions and four divisional cores 45 each of which is disposed between adjacent ones of the support pillar portions 42. The ring-shaped core 30 is shaped like a square in a front view and has four insertion passages 31 which are formed by the base core 41 and the divisional cores 45. Magnetic path forming portions 50 are formed between the joining surfaces 43 of the end portion of each support pillar portion 42 of the base core 41 and the joining surfaces 48 of the link portions 47 of the associated divisional cores 45. In the ring-shaped core 30, lead wires 20 are wound on the arc portions 46 of the divisional cores 45, respectively, and the two end portions of each winding portion 21 are inserted through the associated insertion passage 31.

Also in this modification, a common-mode magnetic path Bc is formed which passes through all of the divisional cores 45 and the end portions of all of the support pillar portions 42 of the base core 41 and plural normal-mode magnetic paths Bn are also formed each of which passes through a divisional core 45 and those two support pillar portions 42 of the base core 41 to which the divisional core 45 is joined. The normal-mode magnetic paths Bn are the same in number as the lead wires 20. As such, the noise filter 10A can reduce both of common-mode noise and normal-mode noise when currents flow through the lead wires 20. Furthermore, since the divisional cores 45 on which the respective lead wires 20 are wound are joined to the end portions of the support pillar portions 42 of the base core 41, the noise filter 10A can be assembled easily and the efficiency of assembling work can be increased.

Features of the above-described noise filters according to the embodiment and its modification of the invention will be summarized below concisely in the form of items (1) to (5):

(1) A noise filter (10) used for a plurality of conducting members (20) (20), the noise filter (10) comprising, a ring-shaped core (30) made from a magnetic material, the ring-shaped core (30) being attached to the plurality of conducting members (20) to reduce noise of currents flowing through each of the plurality of the conducting members (20), the ring-shaped core (30) including:

a base core (41) having a plurality of support pillar portions (42) extending outward in radial directions; and a plurality of divisional cores (45) each being placed between two of the plurality of the support pillar portions (42) adjacent to each other in the circumferential direction, and each having two end surfaces connected to end portions of the two of the plurality of the support pillar portions, the plurality of the divisional cores (45) being configured to allow the plurality of the conducting members (20) to be wound on the plurality of the divisional cores (45), a magnetic path being formed between the end surface of each of the plurality of the divisional cores (45) and the end portion of each of the plurality of the support pillar portions (42) contacting the end surface, the ring-shaped core (30) being configured to form a common-mode magnetic path passing through all of the plurality of the divisional cores (45) and all of the end portions of the plurality of the support pillar portions (42) and normal-mode magnetic paths each passing through one of the plurality of the divisional cores (45) and the two of the plurality of the support pillar portions (42) connected to the one of the plurality of the divisional cores (45), the normal-mode magnetic paths being the same in number as the conducting members (20).

(2) The noise filter (10) according to item (1), wherein
the end surface of each of the plurality of the divisional cores (45) and the end portion of each of the plurality of the support pillar portions (42) contacting the end surface are connected through an adhesive member (60) capable of containing a magnetic material.

(3) The noise filter (10) according to item (1) or item (2), wherein
each of the divisional cores (45) is shaped to have an arc shape.

(4) The noise filter (10) according to any one of item (1) to item (3), wherein
the divisional cores (45) of the ring-shaped core (30) are arranged in a circumferential direction at equal intervals.

(5) The noise filter (10) according to any one of item (1) to item (4), wherein
the ring-shaped core (30) includes: the base core (41) having three of the support pillar portions; and three of the divisional cores (45).

REFERENCE SIGNS LIST 10, 10A: Noise filter
20: Lead wire
30: Ring-shaped core
41: Base core
42: Support pillar portion
45: Divisional core
60: Adhesive member
Bc: Common-mode magnetic path
Bn: Normal-mode magnetic path

The invention claimed is:

1. A noise filter used for a plurality of conducting members, the noise filter comprising, a ring-shaped core made from a magnetic material, the ring-shaped core being attached to the plurality of conducting members to reduce noise of currents flowing through each of the plurality of the conducting members, the ring-shaped core including:

a base core having a plurality of support pillar portions extending outward in radial directions; and a plurality of divisional cores each being placed between two of the plurality of the support pillar portions adjacent to each other in the circumferential direction, and each having two end surfaces connected to end portions of the two of the plurality of the support pillar portions, the plurality of the divisional cores being configured to allow the plurality of the conducting members to be wound on the plurality of the divisional cores, a magnetic path being formed between the end surface of each of the plurality of the divisional cores and the end portion of each of the plurality of the support pillar portions contacting the end surface, the ring-shaped core being configured to form a common-mode magnetic path passing through all of the plurality of the divisional cores and all of the end portions of the plurality of the support pillar portions and normal-mode magnetic paths each passing through one of the plurality of the divisional cores and the two of the plurality of the support pillar portions connected to the one of the plurality of the divisional cores, the normal-mode magnetic paths being the same in number as the conducting members.

2. The noise filter according to claim 1, wherein
the end surface of each of the plurality of the divisional cores and the end portion of each of the plurality of the support pillar portions contacting the end surface are connected through an adhesive member capable of containing a magnetic material.

3. The noise filter according to claim 1, wherein
each of the divisional cores is shaped to have an arc shape.

4. The noise filter according to claim 1, wherein
the divisional cores of the ring-shaped core are arranged in a circumferential direction at equal intervals.

5. The noise filter according to claim 1, wherein
the ring-shaped core includes: the base core having three of the support pillar portions; and three of the divisional cores.

* * * * *